(12) United States Patent
Kitada et al.

(10) Patent No.: US 9,711,418 B2
(45) Date of Patent: Jul. 18, 2017

(54) COMPOSITE SUBSTRATE WITH A HIGH-PERFORMANCE SEMICONDUCTOR LAYER AND METHOD OF MANUFACTURING THE SAME

(71) Applicant: KYOCERA Corporation, Kyoto-shi, Kyoto (JP)

(72) Inventors: Masanobu Kitada, Kyoto (JP); Hideki Matsushita, Kyoto (JP)

(73) Assignee: KYOCERA CORPORATION, Kyoto-Shi, Kyoto (JP)

( * ) Notice: Subject to any disclaimer, the term of this patent is extended or adjusted under 35 U.S.C. 154(b) by 0 days.

(21) Appl. No.: 14/425,433

(22) PCT Filed: Sep. 9, 2013

(86) PCT No.: PCT/JP2013/074257
§ 371 (c)(1),
(2) Date: Mar. 3, 2015

(87) PCT Pub. No.: WO2014/038694
PCT Pub. Date: Mar. 13, 2014

(65) Prior Publication Data
US 2015/0255354 A1 Sep. 10, 2015

(30) Foreign Application Priority Data

Sep. 7, 2012 (JP) ................................. 2012-196917
Sep. 7, 2012 (JP) ................................. 2012-196920

(51) Int. Cl.
*H01L 21/36* (2006.01)
*H01L 21/308* (2006.01)
(Continued)

(52) U.S. Cl.
CPC ........ *H01L 21/86* (2013.01); *H01L 21/02002* (2013.01); *H01L 21/20* (2013.01);
(Continued)

(58) Field of Classification Search
CPC ......... H01L 21/86; H01L 29/36; H01L 29/16; H01L 29/04; H01L 29/0676;
(Continued)

(56) References Cited

U.S. PATENT DOCUMENTS 3,484,662 A * 12/1969 Hagon .................... H01L 21/86
148/DIG. 150
4,662,059 A * 5/1987 Smeltzer ............. H01L 21/3065
148/DIG. 115
(Continued)

FOREIGN PATENT DOCUMENTS

EP 2648210 A1 10/2013
JP 04-089366 A 3/1992
(Continued)

OTHER PUBLICATIONS

International Search Report, PCT/JP2013/074257, Date of Mailing: Nov. 19, 2013, 2 pgs.
(Continued)

*Primary Examiner* — Benjamin Sandvik
*Assistant Examiner* — Damon Hillman
(74) *Attorney, Agent, or Firm* — Volpe and Koenig, P.C.

(57) ABSTRACT

Provided is a composite substrate which has a high-performance semiconductor layer. A composite substrate of the present invention comprises: a supporting substrate which is formed of an insulating material; a semiconductor layer which is formed of a single crystal semiconductor that is superposed on and joined to the supporting substrate; and interfacial inclusions which are present in the interface between the supporting substrate and the semiconductor layer at a density of $10^{12}$ atoms/cm$^2$ or less, and which are formed of a metal element that is different from the constituent elements of the supporting substrate and the semiconductor layer.

18 Claims, 11 Drawing Sheets

(51) Int. Cl.
*H01L 21/86* (2006.01)
*H01L 21/263* (2006.01)
*H01L 21/762* (2006.01)
*H01L 29/04* (2006.01)
*H01L 29/06* (2006.01)
*H01L 29/16* (2006.01)
*H01L 29/36* (2006.01)
*H01L 21/20* (2006.01)
*H01L 21/02* (2006.01)

(52) U.S. Cl.
CPC ........ *H01L 21/2007* (2013.01); *H01L 21/263* (2013.01); *H01L 21/76251* (2013.01); *H01L 29/04* (2013.01); *H01L 29/0649* (2013.01); *H01L 29/16* (2013.01); *H01L 29/36* (2013.01)

(58) Field of Classification Search
CPC ..... H01L 31/0392; H01L 33/18; H01L 33/32; H01L 21/84; H01L 21/263; H01L 21/2007; H01L 21/20
See application file for complete search history.

(56) References Cited

U.S. PATENT DOCUMENTS

| | | | |
|---|---|---|---|
| 8,802,539 B2* | 8/2014 | Allibert | H01L 21/02126 257/506 |
| 2003/0168145 A1 | 9/2003 | Suga et al. | |
| 2004/0226162 A1* | 11/2004 | Miura | H03H 3/08 29/594 |
| 2006/0075957 A1* | 4/2006 | Takeno | C30B 29/06 117/84 |
| 2006/0240642 A1 | 10/2006 | Kerdiles | |
| 2009/0023269 A1 | 1/2009 | Morimoto et al. | |
| 2010/0092786 A1* | 4/2010 | Utsumi | B23K 20/02 428/433 |
| 2013/0299954 A1 | 11/2013 | Kitada et al. | |
| 2014/0042598 A1 | 2/2014 | Kitada et al. | |

FOREIGN PATENT DOCUMENTS

| | | |
|---|---|---|
| JP | 2002-064042 A | 2/2002 |
| JP | 2003-015156 A | 1/2003 |
| JP | 2004-031430 A | 1/2004 |
| JP | 2004-343359 A | 12/2004 |
| JP | 2005-104801 A | 4/2005 |
| JP | 2005-268766 A | 9/2005 |
| JP | 2007-250676 A | 9/2007 |
| JP | 2007-324195 A | 12/2007 |
| JP | 2008-535230 A | 8/2008 |
| JP | 2008-283086 A | 11/2008 |
| JP | 2010-287718 A | 12/2010 |
| WO | 2005/024925 A1 | 3/2005 |
| WO | 2012/074009 A1 | 6/2012 |

OTHER PUBLICATIONS

Japanese Office Action with English concise explanation, Japanese Patent Application No. 2014-534437, Mar. 15, 2016, 5 pgs.
Extended European Search Report, European Patent Application No. 13835397.4, Mar. 31, 2016, 8 pgs.

* cited by examiner (a)

(b)

(a)

(b)

COMPOSITE SUBSTRATE WITH A HIGH-PERFORMANCE SEMICONDUCTOR LAYER AND METHOD OF MANUFACTURING THE SAME

TECHNICAL FIELD

The present invention relates to a composite substrate including a semiconductor layer and a method of manufacturing the same.

BACKGROUND ART

In recent years, techniques for reducing parasitic capacitance have been under development in order to enhance the performance of semiconductor devices. The techniques for reducing parasitic capacitance include an SOS (silicon on sapphire) structure. There is a method for producing the SOS structure by bonding substrates made of different materials together. Examples of a method for bonding substrates made of different materials together include a technique described in Japanese Unexamined Patent Application Publication No. 2004-343359 and a technique described in Japanese Unexamined Patent Application Publication No. 2005-104801. In these patent publications, two substrates made of different materials are bonded together in such a manner that a metal intermediate layer is provided between the substrates.

However, in the case of using the technique described in Japanese Unexamined Patent Application Publication No. 2004-343359 or 2005-104801 to form an SOS structure, a metal making up the metal intermediate layer may possibly diffuse into silicon, which is to be formed into a functional layer of a semiconductor device, to adversely affect the operation of the semiconductor device.

The present invention has been devised under the foregoing circumstances. It is an object of the present invention to provide a composite substrate in which the diffusion of metal into a semiconductor layer is suppressed and a method for manufacturing the same.

A composite substrate according to an embodiment of the present invention includes a supporting substrate composed of an insulating material, a semiconductor layer composed of a single-crystalline semiconductor, and interfacial inclusions. The semiconductor layer is overlaid on the supporting substrate and is bonded to the supporting substrate. The interfacial inclusions with a density of $10^{12}$ atoms/cm$^2$ or less are present at an interface between the supporting substrate and the semiconductor layer and are composed of a metal element different from elements composing up the supporting substrate and the semiconductor layer.

A method of manufacturing a composite substrate according to an embodiment of the present invention includes an activating step and a bonding step. In the activating step, a surface of a supporting substrate and a surface of a semiconductor layer activated in a vacuum vessel using a FAB gun in such a state that the surface of the supporting substrate and the surface of the semiconductor layer do not face each other. In the bonding step, the supporting substrate and the semiconductor layer bonded together at room temperature in such a manner that a first surface activated of the supporting substrate is brought into contact with a second surface activated of the semiconductor layer.

According to the present invention, a composite substrate including a semiconductor layer in which the diffusion of metal is suppressed can be provided.

DESCRIPTION OF EMBODIMENTS

Figure 1:
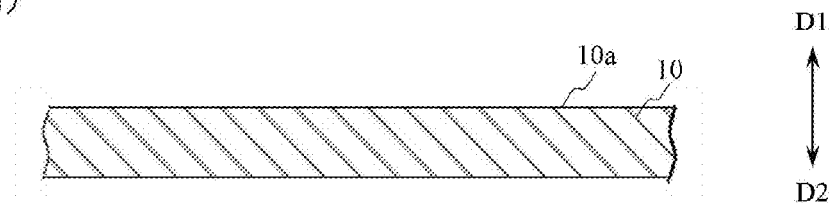
FIGS. 1(a) to 1(d) are sectional views each showing an example of a step of a method for manufacturing a composite substrate according to the present invention.
Figure 1:
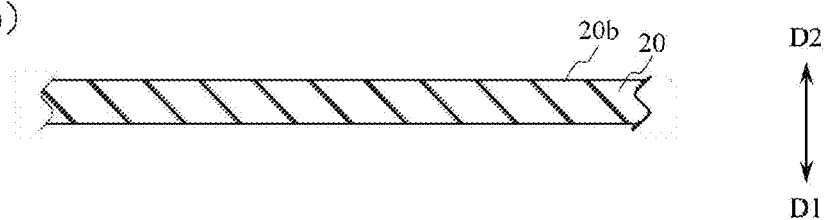
Figure 1:
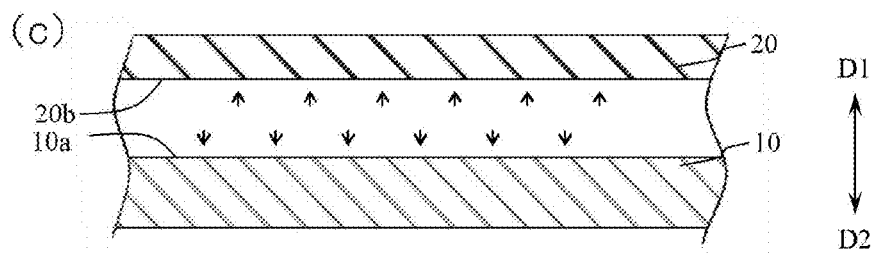
Figure 1:
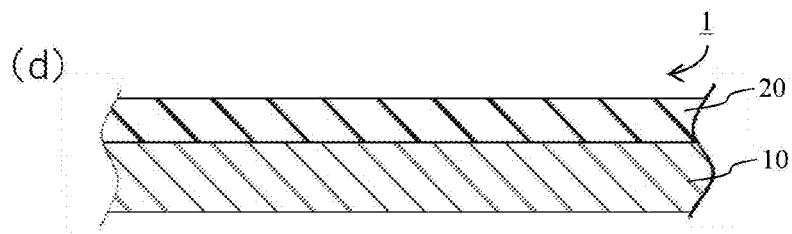

An example of a composite substrate according to an embodiment of the present invention is described together with a method for producing the same with reference to drawings.

The composite substrate 1 includes a supporting substrate 10 and a semiconductor layer 20.

First, as shown in FIG. 1(a), the supporting substrate 10 is prepared. The supporting substrate 10 supports the semiconductor layer 20, which is located thereon, and can be freely selected from those having strength and flatness without limiting crystallinity or the like. Single-crystalline aluminum oxide (sapphire), a silicon carbide substrate, a piezoelectric single-crystalline substrate, quartz, a resin substrate, or the like can be used as a material making up the supporting substrate 10. In this embodiment, sapphire is used as the supporting substrate 10.

The thickness of the supporting substrate 10 ranges from, for example, 400 to 800 [μm]. A principal surface 10a of the supporting substrate 10 functions as a surface bonded to the semiconductor layer 20 and preferably has an arithmetic average roughness, Ra, of 10 nm or less.

Next, as shown in FIG. 1(b), the semiconductor layer 20 is prepared. A material for the semiconductor layer 20 may be a single-crystalline semiconductor material and, for example, silicon (Si), germanium (Ge), and the like can be used. In this embodiment, an Si single-crystal is used as the semiconductor layer 20. A principal surface 20b of the semiconductor layer 20 functions as a surface bonded to the supporting substrate 10 and preferably has an arithmetic average roughness, Ra, of 10 nm or less.

Next, as shown in FIG. 1(c), the principal surface 10a of the supporting substrate 10 and the principal surface 20b of the semiconductor layer 20 are activated. The activation of these bonded surfaces is performed using a room-temperature bonding machine 100 shown in FIG. 2.

The room-temperature bonding machine 100 includes a vacuum chamber (vacuum vessel) 101, a neutron beam (FAB) gun 102, a first stage 103, a second stage 104, and a vacuum pump 105. The vacuum chamber 101 has a vent 101a connected to the vacuum pump 105. The first stage 103 and the second stage 104 are movable in the vacuum chamber 101 and each include a positioning mechanism, which is not shown. The first stage 103 may have a substrate-holding surface 103a (an upward surface in this figure) that can be directed downward. The second stage 104 may have a substrate-holding surface 104a (a downward surface in this figure) that can be directed upward. That is, the first stage 103 and the second stage 104 can undergo displacement including movement in X, Y, and Z-directions and rotation around a single direction using the respective positioning mechanisms. One of the positioning mechanisms of the two stages 103 and 104 may have the function of performing the displacement including rotation. The direction of the substrate-holding surface 103a of the first stage 103 and the direction of the substrate-holding surface 104a of the second stage 104 coincide with the direction of a surface of the supporting substrate 10 and the direction of a surface of the semiconductor layer 20, respectively, which are held thereon. In this example, when a bonded surface is activated, the first stage 103 and the second stage 104 are located on the lower side and the upper side, respectively, and are placed so as to face each other with a space therebetween. The FAB gun 102 is located on the side surface side of the first and second stages 103 and 104 and irradiates a target to be boded held on the upper surface of the first stage 103 and a target to be bonded held on the lower surface of the second stage 104 with a neutron beam in such a manner that the FAB gun 102 is changed in direction with a positioning mechanism, which is not shown.

Herein, in order to maintain the atmosphere in the vacuum chamber 101 under high vacuum, the vacuum chamber 101, a portion of the FAB gun 102, the first stage 103, the second stage 104, the positioning mechanisms of the FAB gun 102, and the positioning mechanisms of the first and second stages 103 and 104 are usually made of a metal material. Therefore, in this embodiment, a cover member 106 is placed so as to cover them. The cover member 106 is made of an insulating material and, for example, silicon oxide, silicon nitride, silicon carbide, and the like can be used. In particular, when it is made of an oxide, nitride, or carbide of an element in a main component making up the supporting substrate 10 or the semiconductor layer 20, the contamination of a new heterogeneous impurity can be suppressed, which is preferred. In the case of using silicon oxide, the same element as that in the semiconductor layer 20 is used and the contamination of the semiconductor layer 20, in which semiconductor device is to be fabricated, with a heterogeneous impurity can be suppressed, which is preferred.

The supporting substrate 10 is held on the first stage 103 such that the principal surface 10a is directed upward, the semiconductor layer 20 held on the second stage 104 such that the principal surface 20b is directed downward, and the principal surfaces 10a and 20b are activated using the FAB gun 102 using the room-temperature bonding machine 100.

Interfacial inclusions 30 made of a metal element different from the materials making up the supporting substrate 10 and the semiconductor layer 20 are supplied to the activated principal surfaces 10a and 20b simultaneously with the activation. As the metal element contained in the interfacial inclusions 30, Fe, Cr, Ni, Cu, Zn, and the like can be exemplified. The amount of supply thereof is determined in consideration of the concentration at the interface therebetween. For example, Fe is $1.5 \times 10^5$ ng/cm$^3$. The amount of supply of the interfacial inclusions 30 can be controlled by varying the area of each of constituent members, which being made of a metal material, exposed from the cover member 106 or the degree of vacuum in the vacuum chamber 101. In this example, the constituent members, which are exposed from the cover member 106 and are made of the metal material, are the vent 101a, a duct section leading thereto, a portion of the FAB gun 102, a portion of each of the first and second stages 103 and 104 only. Increasing the degree of vacuum therein allows the supply of the interfacial inclusions 30 to be reduced. In particular, the degree of vacuum therein is preferably $10^1$ to $10^2$ times higher than the degree of vacuum necessary for the FAB gun 102 to be stably emitted.

Figure 3:
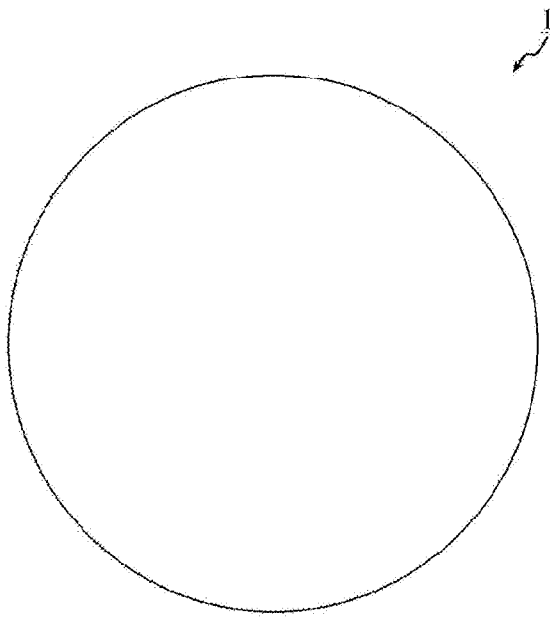
FIG. 3(a) is a plan view showing the schematic configuration of a composite substrate according to an embodiment of the present invention and FIG. 3(b) is a perspective partial sectional view of the composite substrate.
Figure 3:
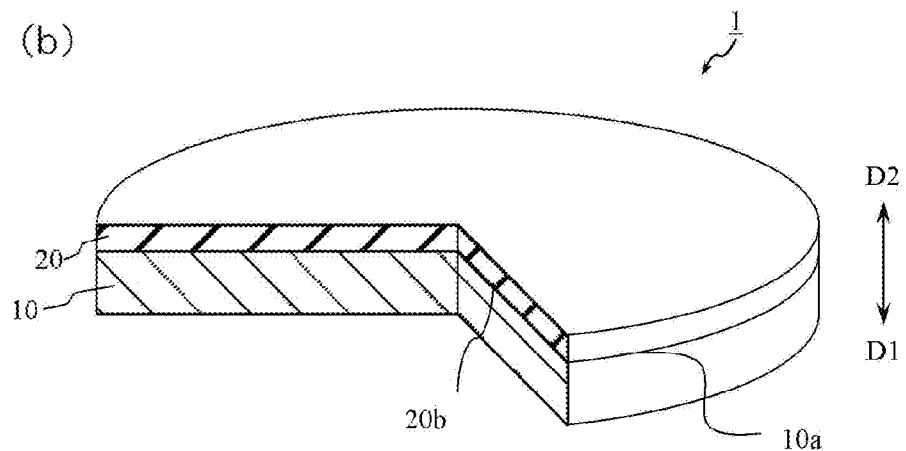

As shown in FIG. 1(d), the principal surface 10a of the supporting substrate 10 and the principal surface 20b of the semiconductor layer 20 are brought into contact with each other in such an activated state, whereby the supporting substrate 10 and the semiconductor layer 20 are bonded to each other in such a state that the interfacial inclusions 30 are held at the interface therebetween. As a result, the composite substrate 1 can be obtained as shown in FIG. 3. An activating step and a bonding step shown in FIG. 1(c) and FIG. 1(d), respectively, are performed at room temperature. Incidentally, the interfacial inclusions 30 are not shown in these figures because the amount of the interfacial inclusions 30 is slight and the interfacial inclusions 30 are distributed at the interface between the supporting substrate 10 and the semiconductor layer 20.

Herein, the density of the interfacial inclusions 30 at the interface between the supporting substrate 10 and the semiconductor layer 20 can be adjusted to $10^{12}$ atoms/cm$^2$ or less in such a manner that the supply of the metal element making up the interfacial inclusions 30 is suppressed in the activating step as shown in FIG. 1(c). This density prevents the interfacial inclusions 30 from covering the principal surface 10a of the supporting substrate 10 and the principal surface 20b of the semiconductor layer 20 and allows arrays of atoms of elements making up the principal surface 10a of the supporting substrate 10 and the principal surface 20b of the semiconductor layer 20 to be exposed.

Herein, the density of the interfacial inclusions 30 refers to the number of atoms per unit surface area at the interface therebetween. In practice, the density thereof is determine in the plane direction in such a manner that a portion of the semiconductor layer 20 on the supporting substrate 10 is dissolved in a certain volume of an etching solution, the amount of the metal element making up the interfacial inclusions 30 is measured by ICP-MS (inductively coupled plasma mass spectroscopy), and all of the metal element is supposed to be present within 5 nm from the interface therebetween in a thickness direction. This supposition is based on the fact that as a result of observing and measuring a plurality of supporting substrates obtained in accordance with this embodiment for the distribution of a metal element in a thickness direction, it has been confirmed that the metal element is present in a region which is located between the supporting substrate 10 and the semiconductor layer 20 and which is within 5 nm and the metal element is hardly distributed in the semiconductor layer 20 even in the case where the amount of the metal element is largest. A surface immediately after activation may be measured by total reflection X-ray fluorescence (TXRF), secondary ion mass spectrometry (SIMS), or the like. Furthermore, a surface of the semiconductor layer 20 may be measured by performing analysis in a thickness direction by SIMS.

The presence of the interfacial inclusions 30 between the supporting substrate 10 and the semiconductor layer 20 at such a density allows the composite substrate 1 to be obtained.

Hitherto, a metal, layer has been essential to bond different materials, like the supporting substrate 10 and the semiconductor layer 20, together at room temperature. This is because metal is allowed to function as an adhesive layer. The amount sufficient to cover a bonded surface at least is necessary and bonding has been impossible when the amount is less than or equal to such an amount (refer to, for example, Japanese Patent No. 4162094). That is, about $3.0 \times 10^{16}$ atoms/cm$^2$ or more of metal has been necessary.

Therefore, metal has been conventionally present between the supporting substrate 10 and the semiconductor layer 20 at a density of at least about $3.0 \times 10^{16}$ atoms/cm$^2$ or more. The metal may possibly diffuse in the semiconductor layer 20 in a heat treatment step of a subsequent semiconductor device-manufacturing process to affect the performance of a semiconductor device or to cause OSF defects.

However, according to this embodiment, the FAB gun 102, which has higher energy as compared to an ion gun for use in conventional room-temperature bonding machines, is used to increase the activity of a bonded surface; hence, bonding can be achieved using a significantly smaller amount of metal as compared to before and the supply of the metal element can be controlled by providing the cover member 106 or adjusting the degree of vacuum. Incidentally, it is generally thought that the atmosphere in the vacuum chamber 101 is under high vacuum and contains few suspended metal particles. Furthermore, it is thought that the possibility of sputtering the vacuum chamber 101 or the like with the FAB gun 102 is low because the FAB gun 102 is extremely highly directional. From this, it has been found that the cover member 106, which is primarily unnecessary according to technical common sense, is necessary to ensure the amount of metal in this embodiment.

In the case of bonding two substrates (a first substrate and a second substrate, or the supporting substrate 10 and the semiconductor layer 20 in this example) together by bringing activated surfaces of the two substrates into contact with each other as described above, a surface of the supporting substrate 10 and a surface of the semiconductor layer 20 may be activated in the activating step in such a state that the supporting substrate 10 and the semiconductor layer 20 do not directly face each other. Descriptions are given below on the assumption that the first substrate is the supporting substrate 10 and the second substrate is the semiconductor layer 20.

Herein, making the supporting substrate 10 and the semiconductor layer 20 not to face each other includes placing an obstacle between the supporting substrate 10 and the semiconductor layer 20. The amount of the interfacial inclusions 30 can be reduced in such a manner that a surface of the supporting substrate 10 and a surface of the semiconductor layer 20 are activated in such a state that the supporting substrate 10 and the semiconductor layer 20 do not face each other. This mechanism is considered.

It has been difficult to stably adjust the amount of metal atoms to about $10^{13}$ atoms/cm$^2$ or less even by using the FAB gun 102 or providing the cover member 106. Therefore, an assumption below has been made about the mechanism of contamination of the metal atoms.

That is, in the case where the supporting substrate 10 and the semiconductor layer 20 face each other in the activating step, when one of them is irradiated with a neutron beam, surroundings of a stage holding the one are etched and etched things (etched substances) may possibly be suspended in a vacuum atmosphere to adhere to the other. If the other is also activated, then the suspended etched substances are more likely to adhere to the other as compared to the case where the other is not activated. Herein, the etched substances include a metal material making up the first stage 103 or the second stage 104 and impurities such as contaminants adhering to each stage.

In other words, it has been thought that a secondary sputtering effect is applied to the first stage 103 and the second stage 104 because the application of a neutron beam for activating a surface of the supporting substrate 10 and a surface of the semiconductor layer 20 is performed at once in such a state that these surfaces face each other.

In order to verify this assumption, the amount of two surfaces metal atoms has been measured in such a manner. One of two surfaces is obtained in such a manner that the supporting substrate 10 and the semiconductor layer 20 are placed so as to face each other, surfaces thereof are activated at the same time. The other of two surfaces is obtained in such manner that one of the supporting substrate 10 and the semiconductor layer 20 only is placed in the room-temperature bonding machine 100, a surface thereof is activated. And, the supporting substrate 10 and the semiconductor layer 20 are taken out of the room-temperature bonding machine 100 before bonding. As a result, it was confirmed that the amount of the metal atoms could be significantly reduced in the latter, in which one of them only was activated.

The above verification experiment could confirm that keeping a non-facing state in the activating step was important in reducing the amount of metal atoms. In the non-facing state, the semiconductor layer 20 is preferably separated from the supporting substrate 10 in terms of time and space in such a manner that, for example, the semiconductor layer 20 is held in a waiting space or the like while the supporting substrate 10 is being activated.

The activated first surface of the supporting substrate 10 and the activated second surface of the semiconductor layer 20 are positioned using the positioning mechanisms, which are not shown, of the first and second stages 103 and 104 so as to face each other and are brought into contact with each other, whereby the supporting substrate 10 and the semiconductor layer 20 can be bonded to each other.

As described above, according to this embodiment, the density of the interfacial inclusions 30 can be reduced and the supporting substrate 10 and the semiconductor layer 20 can be bonded to each other.

Bonding can be kept and the occurrence of the precipitation of a metal element at an interface can be suppressed only after the density of impurity metals of the interfacial inclusions 30 is adjusted to $10^{12}$ atoms/cm$^2$ or less. This mechanism is described in detail.

In the case where a metal element is aggregated between the supporting substrate 10 and the semiconductor layer 20, the operation of semiconductor devices fabricated in the semiconductor layer 20 may possibly be adversely affected. The aggregation of such a metal element is a problem certainly assumed in the case where the metal element is placed at the interface therebetween in the form of layers or islands (the density of the metal element at the interface is, for example, about $3.0 \times 10^{16}$ atoms/cm$^2$ or more). When the density is more than $10^{12}$ atoms/cm$^2$ to less than about $3.0 \times 10^{16}$ atoms/cm$^2$, the metal element is aggregated in the course of performing heat treatment for fabricating a semiconductor device even though the metal element is distributed in a bonded surface during bonding and therefore the presence thereof cannot be confirmed. However, adjusting the density of the metal element at the interface to $10^{12}$ atoms/cm$^2$ or less allows the metal element to be prevented from being aggregated even though the composite substrate 1 is heat-treated.

This mechanism is not clear but is probably involved in the solid solubility of the metal element with respect to an element making up the semiconductor layer 20. That is, the density of the interfacial inclusions 30 is $10^{12}$ atoms/cm$^2$ or less and is not such a density that the interfacial inclusions 30 are in contact with each other and form aggregates. The mobility thereof is low at room temperature. Therefore, no aggregates are formed during bonding. In addition, when the supply of metal is such that the density at the interface is $10^{12}$ atoms/cm$^2$ or less, the metal element is present in an amount only about 10 times the solid solubility even though the mobility is increased by performing heat treatment. Even in this state, no aggregates are probably formed.

Furthermore, most of metal atoms in the interfacial inclusions 30 form solid solutions with the element making up the semiconductor layer 20 and therefore cannot migrate freely. The rest of the metal atoms are significantly spaced apart from each other. Therefore, the metal atoms cannot be aggregated or cannot form such large defects that promote diffusion.

In the case where the semiconductor layer 20 is made of Si and metal elements making up the interfacial inclusions 30 include Fe, when the density thereof is more than $10^{12}$ atoms/cm$^2$, this value is a threshold and the number of OSF defects increases sharply. A cause of the OSF defects includes lattice defects. A compound of Fe and O may possibly migrate to a surface using these defects as footholds and may possibly precipitate to form the OSF defects. The threshold of abundance of Fe that causes the OSF defects coincides with the upper limit of the density of the interfacial inclusions 30 in this embodiment.

Although there is no direct relation between the aggregation of metal and the OSF defects, there is a commonality therebetween when attention is focused on the phenomenon that metal atoms migrate, aggregate, and precipitate in a semiconductor layer. Therefore, factors causing the OSF defects, that is, factors that are the presence of defects and the combination of metal (Fe) with oxygen are investigated. Since the composite substrate 1 according to this embodiment is obtained in such a manner that bonded surfaces of the semiconductor layer 20 and the supporting substrate 10 are activated and are directly bonded to each other with dangling bonds formed, the dangling bonds may possibly remain at a bonding interface in the form of defects. Since heat treatment is performed after bonding for the purpose of forming semiconductor devices, a metal element and the element making up the semiconductor layer 20 or an element making up the supporting substrate 10 may possibly form an intermetallic compound at the bonding interface to produce the interfacial inclusions 30. The two assumptions, that is, the presence of defects at the interface and the presence of the interfacial inclusions 30, which are formed of the intermetallic compound, at the interface include two factors causing the OSF defects. This suggests the possibility that, in the composite substrate 1 according to this embodiment, the interfacial inclusions 30 migrate and precipitate using the defects at the interface as footholds as with the case of the OSF defects, which are caused in such a manner that Fe migrates and precipitates using defects as footholds. From the above, it is inferred that adjusting the density of the metal element making up the interfacial inclusions 30 to not less than the threshold for causing the OSF defects allows the diffusion or aggregation of the metal element to be suppressed.

The lower limit of the density of the metal element making up the interfacial inclusions 30 is not particularly limited and is a value sufficient to bond the supporting substrate 10 and the semiconductor layer 20 together at room temperature. In particular, it has been confirmed that when the density of the metal element is $10^{10}$ atoms/cm$^2$ or more, a bond strength substantially equal to the case of bonding performed in accordance with Japanese Patent No. 4162094 in such a state that the amount of metal is large can be ensured. Incidentally, it is inferred that, during heat treatment subsequent to bonding, it diffuses from the bonding interface and the density thereof may possibly decrease to about $10^8$ atoms/cm$^2$.

As described above, according to this embodiment, the composite substrate 1 can be provided such that the composite substrate 1 includes the semiconductor layer 20, in which the diffusion of metal is suppressed, and has a sufficient bond strength between the supporting substrate 10 and the semiconductor layer 20.

(Modification 1)

In the above embodiment, a sapphire substrate having a bonded surface (a principal surface 10a) which is an R-plane is preferably used as the supporting substrate 10.

The interplanar spacing of the R-plane of the sapphire substrate is closer to the lattice constant of an Si single-crystal as compared to the C-plane of the sapphire substrate or the like; hence, the composite substrate 1 can be obtained such that structural disorder, due to lattice mismatching, on the principal surface 20b side of the semiconductor layer 20 is suppressed.

Herein, the supporting substrate 10 and the semiconductor layer 20 have been conventionally bonded together with a layer of a metal element therebetween, the metal element being different in crystallinity and lattice constant from the supporting substrate 10 and the semiconductor layer 20; hence, the lattice constants of the two have slightly correlated to bonding and properties for fabricating semiconductor devices.

However, according to the above embodiment, the density of the interfacial inclusions 30 is $10^{10}$ atoms/cm$^2$ to $10^{12}$ atoms/cm$^2$ and therefore the percentage that atoms making up the supporting substrate 10 and atoms making up the semiconductor layer 20 are directly bonded together is very large. In particular, the percentage that the atoms are bonded together with a metal element therebetween is supposed to be on the order of ppm, the metal element being the interfacial inclusions 30, because the number of all atoms per 1 cm$^2$ is about $10^{16}$ atoms in this example.

Therefore, the lattice constants of the supporting substrate 10 and the semiconductor layer 20 are strongly meaningful. That is, the lattice constants thereof are close to each other and are slightly mismatched; hence, the bond between the two is strong and the crystal structure of the semiconductor layer 20 is unlikely to be disordered. Therefore, the following possibility is low: the possibility that properties of semiconductor devices are deteriorated by the occurrence of dislocations trapping carriers or the occurrence of unintended stress due to strain.

Since the supporting substrate 10 and the semiconductor layer 20 can be directly bonded together in such a state that the lattice constants thereof are slightly mismatched, semiconductor properties of Si are not impaired but are sufficiently exploited and the occurrence of capacitance between the two can be suppressed. That is, the composite substrate 1 can be provided such that semiconductor properties of the semiconductor layer 20, which is made of Si, and low dielectric properties of the supporting substrate 10, which are made of sapphire, are both achieved.

Furthermore, the R-plane of sapphire is used as the supporting substrate 10, whereby Al atoms are arranged on the bonded surface side of semiconductor layer 20 and no O atoms are exposed. Therefore, the supporting substrate 10 and the semiconductor layer 20 can be bonded together without involving O atoms causing the OSF defects in bonding; hence, the occurrence of the OSF defects can be suppressed. Even in the case of using an insulating oxide as the supporting substrate 10, metal atoms can be bonded to each other and therefore bond strength can be increased.

The use of the R-plane of sapphire as the supporting substrate 10 enables the proportion of dangling bonds (unsaturated bonds) not involved in bonding to be reduced when activated surfaces of the supporting substrate 10 and the semiconductor layer 20 are brought into contact with each other and are bonded together. This allows the number of defects or pores, due to unsaturated bonds in a bonding interface, in the bonding interface to be reduced and therefore allows the bonding interface to be kept well. Since the number of the defects or pores in the bonding interface is reduced, the aggregation or diffusion of metal atoms can be suppressed.

(Modification 2)

In the above embodiment, the semiconductor layer 20 preferably has an oxygen concentration of less than $5 \times 10^{17}$ [atoms/cm$^3$]. When the oxygen concentration of the semiconductor layer 20 is high, oxygen combines with a metal element and promotes the migration or diffusion of metal atoms making up the interfacial inclusions 30. However, the oxygen concentration thereof is controlled as described above, whereby metal is inhibited from diffusing, forming a solid solution, or precipitating in the semiconductor layer 20. In particular, when the metal is Fe, the occurrence of the OSF defects can be suppressed.

In order to allow the semiconductor layer 20 to have such an oxygen concentration, an epitaxial Si layer is formed on a single-crystalline Si substrate, the epitaxial layer is bonded to the supporting substrate 10, the single-crystalline Si substrate is then removed, and the epitaxial layer may be used as the semiconductor layer 20. The use of the epitaxial layer as the semiconductor layer 20 allows the contamination of oxygen to be suppressed with high crystallinity maintained because of a film formed in a vacuum.

(Modification 3)

In the above embodiment, a face on the principal surface 20b side of the semiconductor layer 20 is preferably undoped. This configuration suppresses the occurrence of strain, due to the presence of a dopant, in the crystal of the semiconductor layer 20. Therefore, the following possibility is low: the possibility that properties of semiconductor devices are deteriorated by the occurrence of dislocations trapping carriers or the occurrence of unintended stress due to strain.

In order to achieve this configuration, an undoped epitaxial Si layer or an epitaxial Si layer is formed on a single-crystalline Si substrate such that the concentration of a dopant decreases gradually and a surface is in an undoped state, the epitaxial layer is bonded to the supporting substrate 10, the single-crystalline Si substrate is then removed, and the epitaxial layer may be used as the semiconductor layer 20. The use of the epitaxial layer allows the amount of the dopant to be readily controlled with high crystallinity maintained.

(Modification 4)

In the above embodiment, the interfacial inclusions 30 preferably form a metal silicide or a metal oxide. For example, $SiFeO_x$, $AlFeO_x$, and the like can be exemplified.

In order to allow the metal atoms making up the interfacial inclusions 30 to be present in the form of an intermetallic compound such as a metal silicide or a metal oxide, the interfacial inclusions 30 may be produced in such a manner that heat treatment is performed at 500° C. or higher for 0.5 hour or more after the bonding step shown in FIG. 1 such that the metal atoms combine with the element making up the semiconductor layer 20 or the element making up the supporting substrate 10. The metal atoms are supplied during the activation of the bonded surfaces of the semiconductor layer 20 and the supporting substrate 10 and therefore are present at the bonding interface and bonds to atoms present at the bonded surfaces of the semiconductor layer 20 and the supporting substrate 10 are formed by heat treatment.

Herein, in the composite substrate 1, the metal amount of the metal atoms making up the interfacial inclusions 30, which are present at the bonding interface, is $10^{12}$ atoms/cm$^2$ or less, and therefore the diffusion or aggregation of the metal atoms can be suppressed. Hence, the interfacial inclusions 30, which are present in the form of an intermetallic compound, remain at the bonding interface between the semiconductor layer 20 and the supporting substrate 10. When a metal element forms an intermetallic compound, pores are produced therearound because the element making up the semiconductor layer 20 is supplied to combine with the metal element or the element making up the supporting substrate 10 s supplied to combine with the metal element. The pores serve as defects. When a new impurity is present at the interface, the pores getter the impurity and therefore the diffusion of the impurity into the semiconductor layer 20 can be suppressed.

(Modification 5)

Figure 4:
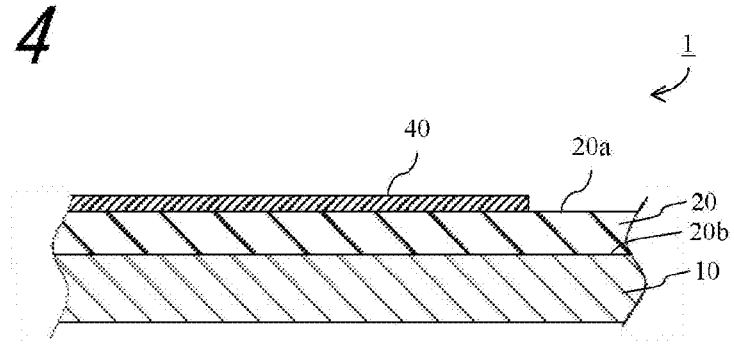
FIG. 4 is a sectional view showing a modification of the composite substrate shown in FIG. 3.

In the above embodiment, an oxide layer 40 may be formed on the side of a second principal surface 20a of the semiconductor layer 20 as shown in FIG. 4. The oxide layer 40 may be formed by thermal oxidation. In the case where a portion of the semiconductor layer 20 is oxidized into the oxide layer 40, Si is ejected from the oxide layer 40 to a remaining portion of the semiconductor layer 20 with a change in volume, interstitial Si in a surface of the semiconductor layer 20 that is on the oxide layer 40 side is increased, and therefore the density of Si atoms per unit volume is increased.

However, there is no layer of an oxide or no increase in the number of Si atoms between the semiconductor layer 20 and the supporting substrate 10. Herein, it is known that the presence of interstitial Si is the cause of promoting the occurrence of the OSF defects. In the composite substrate 1, a portion contaminated with a metal element causing the OSF defects is the interface between the supporting substrate 10 and the semiconductor layer 20. In the vicinity of the interface therebetween, the density of Si atoms per unit volume is less as compared to a surface that is on the oxide layer 40 side, the density thereof showing the concentration of interstitial Si; hence, the occurrence of the OSF defects can be suppressed.

Furthermore, in the semiconductor layer 20, interstitial Si of another site is less than that of the surface that is on the oxide layer 40 side; hence, the occurrence of tensile strain in the crystal structure of the semiconductor layer 20 can be suppressed and the influence of semiconductor devices on the mobility of carriers can be reduced.

The strain due to interstitial Si or the like can be estimated in such a manner that a semiconductor device is formed in the semiconductor layer 20 and the mobility of carriers is measured.

In the above embodiment and modifications, the semiconductor layer 20 may be a substrate or a thin layer and the thickness thereof ranges from, for example, 30 nm to 200 nm.

In particular, the semiconductor layer 20 is preferably formed in a step below. First, an undoped epitaxial layer is formed on a heavily doped single-crystalline Si substrate. A dopant diffuses from the heavily doped single-crystalline Si substrate into the epitaxial layer during epitaxial growth. This allows the lower surface of the epitaxial layer to have a high dopant concentration and allows the upper surface thereof to remain undoped. The upper surface of the epitaxial layer is bonded to the supporting substrate 10. After the two are bonded together, the heavily doped single-crystalline Si substrate and a portion of the epitaxial layer that contains a certain amount or more of the dopant diffusing from the substrate are removed. They may be removed using, for example, a selective etchant of which the etching rate is high at a high dopant concentration and decreases sharply at a threshold dopant concentration. Examples of the selective etchant include a mixture of hydrofluoric acid, nitric acid, and acetic acid; a mixture of hydrofluoric acid, nitric acid, and water; and the like. In particular, descriptions are given using the mixture of hydrofluoric acid, nitric acid, and acetic acid as an example. This etchant is prepared such that the etching rate with respect to silicon decreases by a certain value or more at a threshold resistance higher than the resistance of the semiconductor layer 20. In other words, this etchant is prepared such that the etching rate with respect to silicon decreases by a certain value or more at a dopant concentration corresponding to a threshold that is a dopant concentration lower than the dopant concentration of the semiconductor layer 20.

The expression "the etching rate decreases by a certain value or more" as used herein means that there is an inflection point in a graph showing the relationship between the etching rate and the concentration of a dopant or that the etching rate decreases by 1/10 or more at a threshold. In this example, this etchant is prepared such that the etching rate decreases significantly at a threshold resistance of 1 to 4 [Ω·cm] (the dopant concentration corresponding to this threshold is $7 \times 10^{17}$ to $2 \times 10^{18}$ [atoms/cm$^3$]) in this embodiment, in which p-type silicon is used. When the mixing ratio of hydrofluoric acid to nitric acid to water is, for example, 1:3:8, the etching rate varies by 1/1,000 or more at a threshold. Examples of another method for performing selective etching include an electrolytic etching method using an about 5% hydrofluoric acid solution, a pulsed electrode anodic oxidation method using a KOH solution, and the like. The use of this etchant allows the change in dopant concentration of the epitaxial layer to automatically act as an etching stop layer. The heavily doped single-crystalline Si substrate and a portion of the epitaxial layer are removed as described above and a remaining portion thereof is used as the semiconductor layer 20. The semiconductor layer 20, which is obtained through this step, is an undoped region and has a p$^-$ dopant concentration of $1 \times 10^{16}$ [atoms/cm$^3$] or less and a p$^-$ dopant concentration of $5 \times 10^{15}$ [atoms/cm$^3$] or less. The term "undoped one" as used herein simply refers to silicon not intentionally doped with an impurity and is not limited to intrinsic silicon, which contains no impurity, or the like. The dopant used in this example is boron (B). The semiconductor layer 20 can be obtained in the form of a full depletion layer as described above and the thickness of the full depletion layer can be adjusted to 200 nm or less. In the composite substrate 1, which is formed through these steps, the semiconductor layer 20 is directly bonded to the supporting substrate 10 at room temperature with no oxide layer or the like therebetween; hence, the occurrence of the OSF defects can be suppressed and the semiconductor layer 20 can be ensured to be dense and have few defects. Since the semiconductor layer 20 is such a thin full depletion layer with few defects and is directly bonded to the supporting substrate 10, advantages such as insulating properties and high heat dissipation properties of the supporting substrate 10 can be applied to semiconductor devices.

(Modification of Manufacturing Method: Non-facing State)

In the above description of the manufacturing method, the supporting substrate 10 and the semiconductor layer 20 are kept in the non-facing state as described above. A particular example thereof is described. FIGS. 8(a) to 8(d) each show an example of the arrangement of the first stage 103, the second stage 104, and the FAB gun 102. In the figures, a principal surface of the supporting substrate 10 that is opposite to the side in contact with the first stage 103 is the principal surface 10a. Likewise, a principal surface of the semiconductor layer 20 that is opposite to the side in contact with the second stage 104 is the principal surface 20b.

Figure 8:
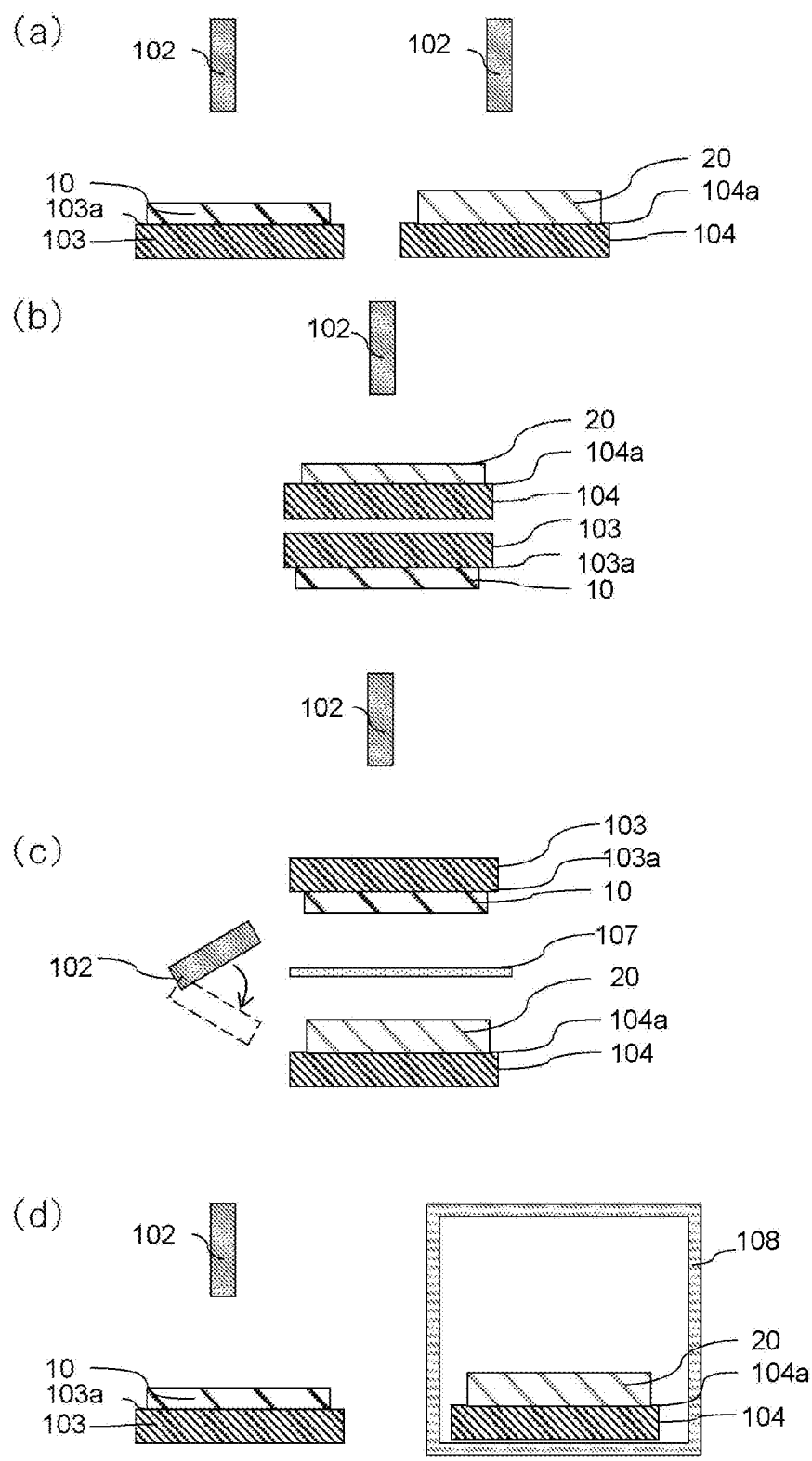
FIGS. 8(a) to 8(d) are substantial schematic views each showing an example of the arrangement of a first stage and a second stage in a vacuum chamber 101.

The non-facing state may be achieved in such a manner that, for example, the substrate-holding surface 103a of the first stage 103 and the substrate-holding surface 104a of the second stage 104 are placed so as to face the same direction and are irradiated in the same direction using the FAB gun 102 as shown in FIG. 8(a). In particular, positions in plan view are preferably displaced as shown in FIG. 8(a). In other words, in the surface activating step, it is preferred that the position of the first stage 103 and the position of the second stage 104 do not overlap each other in the X-Y plane.

As shown in FIG. 8(b), the substrate-holding surface 103a of the first stage 103 and the substrate-holding surface 104a of the second stage 104 may be arranged back-to-back, although positions in plan view overlap each other. In other words, the first stage 103 and the second stage 104 may be placed such that the substrate-holding surface 103a of the first stage 103 and the substrate-holding surface 104a of the second stage 104 face opposite directions and a surface of the first stage 103 that is opposite to the substrate-holding surface 103a and a surface of the second stage 104 that is opposite to the substrate-holding surface 104a face each other. The FAB gun 102 is placed so as to face each of the substrate-holding surface 103a of the first stage 103 and the substrate-holding surface 104a of the second stage 104 and is used to activate a surface of the supporting substrate 10 and a surface of the semiconductor layer 20.

As shown in FIG. 8(c), the substrate-holding surface 103a of the first stage 103 and the substrate-holding surface 104a of the second stage 104 may be spaced apart from each other with a shielding plate 107 placed therebetween. The FAB gun 102 is located on the side surface side of the first stage 103 and the second stage 104 and irradiates the substrate held on the substrate-holding surface 103a of the first stage 103 and the substrate held on the substrate-holding surface 104a of the second stage 104 with a neutron beam in such a manner that the FAB gun 102 is changed in direction with a positioning mechanism, which is not shown.

The shielding plate 107 is preferably made of a material unlikely to be sputtered by the irradiation of the FAB gun 102 and may be made of, for example, a single-crystalline material such as quartz; a ceramic material such as silicon oxide, aluminum oxide, or silicon nitride; or the like. Herein, when at least one of two bonded substrates is made of a material affecting electric properties like the semiconductor layer 20, the shielding plate 107 is preferably formed from an insulator mainly containing the same component as a main component element making up these substrates. In the case of using, for example, a silicon substrate, silicon oxide ($SiO_x$) is preferably used. In this case, even if the shielding plate 107 is etched by the FAB gun 102, atoms of the element making up the semiconductor layer 20 are suspended and may possibly adhere to the semiconductor layer 20. The influence thereof can be suppressed to a low level.

As shown in FIG. 8(d), while one of the substrates is being activated, the other may be moved to a waiting space 108 isolated from a space which is a portion of the vacuum vessel 101 and in which the FAB gun 102 is irradiated. This configuration allows the surface activation of the supporting substrate 10 and the surface activation of the semiconductor layer 20 to be temporally and spatially separated from each other and also allows the non-facing state to be temporally and spatially maintained.

When the room-temperature bonding machine 100 includes a substrate transfer chamber connected to the vacuum vessel 100, the substrate transfer chamber may be used as the waiting space 108. The substrate transfer chamber can be evacuated. When the substrate transfer chamber is used as the waiting space 108, a substrate is preferably kept waiting in the substrate transfer chamber after the substrate transfer chamber is evacuated.

In the examples shown in FIGS. 8(a) to 8(c), the surface activation of the supporting substrate 10 and the surface activation of the semiconductor layer 20 may be performed at the same time or may be separately performed at an interval. In the case of separately performing the activation of the supporting substrate 10 and the activation of the semiconductor layer 20 at an interval, the activation of the supporting substrate 10 and the activation of the semiconductor layer 20 can be temporally and spatially separated from each other and the amount of metal can be more reduced, which is preferred.

Furthermore, as described in the above embodiment, the activating step and the bonding step are performed in the single vacuum vessel 101. However, a vacuum vessel dedicated for the activating step may be provided such that the supporting substrate 10 and the semiconductor layer 20 are charged thereinto and substrates are moved after activation and are transferred to a vacuum vessel dedicated for the bonding step. In this case, the placement of the FAB gun 102 can be optimized without consideration of the bonding step and a vessel which is smaller than the vacuum vessel for the bonding step and which has a simple configuration can be used. Therefore, an unintentional impurity can be eliminated by increasing the degree of vacuum.

When the supporting substrate 10 and the semiconductor layer 20 have a large size, a plurality of FAB guns 102 need to be used to uniformly activate the whole surface of each of the supporting substrate 10 and the semiconductor layer 20.

Figure 9:
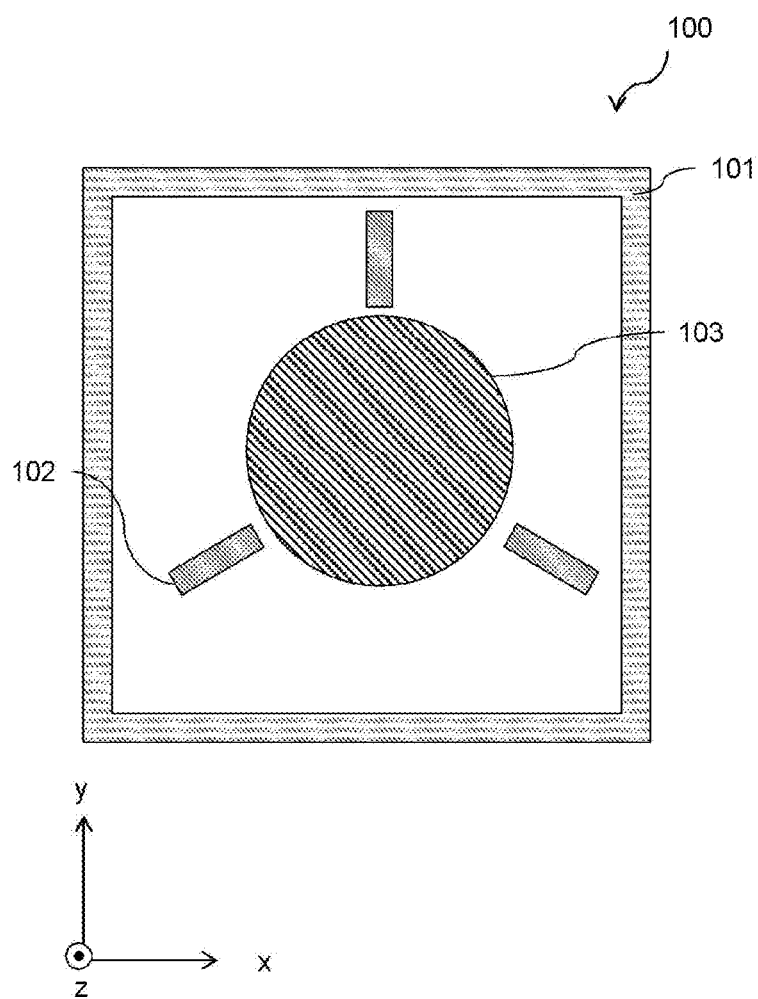
FIG. 9 is a schematic view showing an example of the arrangement of FAB guns in a bonding machine.

In this case, the FAB guns 102 are preferably placed so as not to face each other as shown in FIG. 9. FIG. 9 is a perspective plan view of the vacuum chamber 101 viewed from above. When the FAB guns 102 are placed so as to face each other, members of the structure of each FAB gun 102 are sputtered because neutron beams from the FAB guns 102 have high energy; hence, properties of the composite substrate 1 may possibly be affected.

When the FAB guns 102 are placed so as to face each other, a cover made of a material similar to the shielding plate 107 may be provided on each FAB gun 102 such that the exposure of the FAB gun 102 is minimized. When one of the FAB guns 102 is irradiated, another one of the FAB guns 102 that is present in a position facing that FAB gun 102 may be covered with the cover such that a state that the FAB guns 102 face each other is temporally separated.

(Modification: activating step)

In the above example, the supporting substrate 10 and the semiconductor layer 20 are each activated once only using the FAB gun 102. The supporting substrate 10 and the semiconductor layer 20 may be activated twice or more at intervals.

There are probably two advantages in performing the irradiation of the FAB gun 102 several times. The first advantage is the cleaning of the atmosphere in the vacuum chamber 101. The irradiation of the supporting substrate 10 and the semiconductor layer 20 with the FAB gun 102 reduces the degree of vacuum because of three factors below. First, atoms of C, H, O, and the like adsorbed on surfaces of the supporting substrate 10 or semiconductor layer 20 which has been placed in air are sputtered and are suspended in the vacuum chamber 101. Second, atoms making up the supporting substrate 10 or the semiconductor layer 20 are sputtered and are suspended in the vacuum chamber 101. Third, constituent members (for example, the first stage 103 and the second stage 104), made of a metal material, located in the vacuum chamber 101 are irradiated with the FAB gun 102 and metal atoms thereof are suspended in the vacuum chamber 101. The amount of impurities present at the bonding interface can be reduced in such a manner that after such suspended atoms are removed by evacuating the vacuum chamber 101 to high vacuum, a surface of the supporting substrate 10 and a surface of the semiconductor layer 20 are activated by applying the FAB gun thereto again and are bonded together.

When the reduction of the amount of impurities is an object, the irradiation of the FAB gun 102 several times is effective in the case of activating two surfaces to be activated in such a state that the two surfaces face each other and in the case of activating the two surfaces in the non-facing state. Irradiation conditions of the FAB gun 102 that depend on the acceleration voltage, irradiation time, and irradiation distance of the FAB gun 102 can be freely set at the first irradiation and the second irradiation if the arithmetic average roughness, Ra, is not so impaired that bonding is adversely affected.

Herein, the energy, emitted from the FAB gun 102, actually reaching a surface to be activated is different from a value in the irradiation conditions of the FAB gun 102. However, the energy actually reaching the surface to be activated depends on the product of the acceleration voltage and irradiation time of the FAB gun 102. Therefore, the product of the acceleration voltage and irradiation time thereof is hereinafter referred to as a cumulative irradiation energy estimate (simply referred to as cumulative irradiation energy in some cases).

Conditions of the first irradiation and the second Irradiation may be set such that the first irradiation conditions are substantially the same as the second irradiation conditions or the first cumulative irradiation energy is less or greater than the second cumulative irradiation energy. When the first cumulative irradiation energy is less than the second cumulative irradiation energy, impurities adhering to the principal surfaces 10a and 20b, which are to be activated, are removed in advance and the principal surfaces 10a and 20b can be then fully activated.

The second advantage is the ensuring of bond strength. When the supporting substrate 10 and the semiconductor layer 20 are irradiated with the FAB gun 102, sputtered atoms are suspended in the vacuum chamber 101, re-adhere to the activated surface of the supporting substrate 10 and the activated surface of the semiconductor layer 20, and may possibly reduce the bond strength therebetween. This is significant when time elapses until the activated two are bonded together. Therefore, in the case where two surfaces to be activated are activated in the non-facing state and the non-facing state is temporally separated, it is particularly effective. The irradiation conditions of the FAB gun 102 can be freely set at the first irradiation and the second irradiation. In order to reduce the amount of the metal atoms making up the interfacial inclusions 30, the second irradiation may be performed with lower acceleration voltage or for a shorter time as compared to the first irradiation. This is because it is suppressed that the amount of metal atoms is increased by newly sputtering constituent members containing metal during the second irradiation. Even though the second irradiation of the FAB gun 102 is performed with low acceleration voltage, the reactivation of a surface which has been activated once is sufficient. That is, the degree of activation can be increased in such a manner that dangling bonds are formed by breaking atomic bonds in the supporting substrate 10 and the semiconductor layer 20 during the first irradiation of the FAB gun 102 and C and the like adhering to the dangling bonds are removed during the second irradiation.

After the first irradiation of the FAB gun 102 is performed in the non-facing state, the second irradiation of the FAB gun 102 may be performed in such a state that the supporting substrate 10 and the semiconductor layer 20 face each other. In this case, when the cumulative irradiation energy estimated from the product of the acceleration voltage and irradiation time of the FAB gun 102 during the second irradiation is less than that during the first irradiation, bonding can be performed in such a state that the amount of the metal atoms making up the interfacial inclusions 30 is small. It has been confirmed that when the acceleration voltage of the FAB gun 102 during the second irradiation is, for example, about one-third to two-thirds of that during the first irradiation and the irradiation time of the FAB gun 102 during the second irradiation is, for example, about one-tenth to one-third of that during the first irradiation, the effect of reducing the amount of metal atoms can be maintained and high bond strength can be achieved.

Of course, the first irradiation and the second irradiation may be both performed in the non-facing state. In this case, when the irradiation time of the FAB gun 102 during the second irradiation is about one-tenth to one-third of that during the first irradiation, activated surfaces can be bonded together immediately after activation.

The irradiation of the FAB gun 102 several times is not necessarily needed for both the supporting substrate 10 and the semiconductor layer 20. For example, in the case where the supporting substrate 10 and the semiconductor layer 20 are not activated at the same time by the irradiation of the first irradiation of the FAB gun 102, one of them that is primarily activated may be subjected to the second irradiation of the FAB gun 102.

As described above, at least one of the supporting substrate 10 and the semiconductor layer 20 may be subjected to the irradiation of the FAB gun 102 several times.

(Electronic Component)

An electronic component including at least one device section may be formed in such a manner that a plurality of device sections are formed in the composite substrate 1 described in one of the above embodiment and modifications and the composite substrate 1 is divided.

Figure 10:
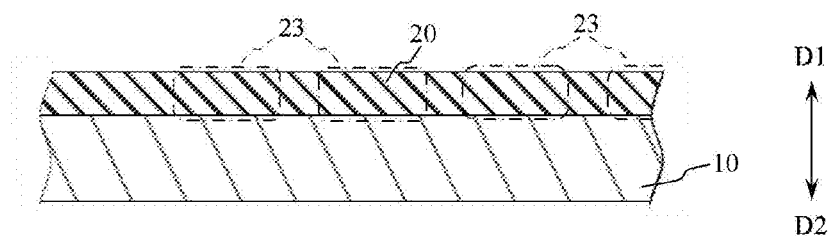
FIGS. 10(a) and 10(b) are partial sectional views each showing a step of a method for manufacturing an electronic component from a composite substrate.
Figure 10:
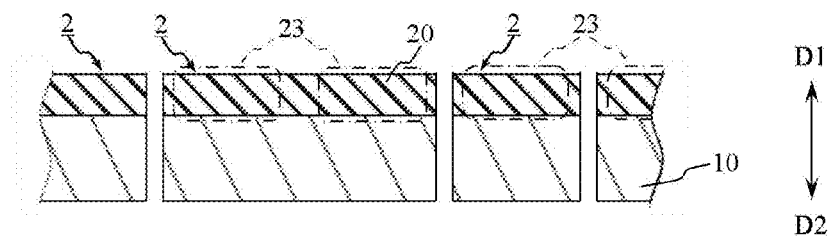

In particular, as shown in FIG. 10(a), device sections 23 are formed from the upper surface side of the semiconductor layer 20 of the obtained composite substrate 1. Various semiconductor device structures can be cited as the device sections 23.

Next, as shown in FIG. 10(b), the composite substrate 1 having the device sections 23 is divided, whereby electronic components 2 are manufactured. The composite substrate 1 is divided into the electronic components 2 such that one of the electronic components 2 includes at least one of the device sections 23. In other words, one of the electronic components 2 may include some of the device sections 23.

As described above, the electronic components 2, which include the device sections 23, can be manufactured.

EXAMPLES

Example 1

A composite substrate 1 was formed under conditions below on the basis of the above embodiment.

A supporting substrate 10: A 6 inch sapphire substrate.
A bonded surface (principal surface) 10a of the supporting substrate 10: An R-plane.
A semiconductor layer: An undoped epitaxial Si layer with a thickness of 2 μm was deposited on a single-crystalline Si substrate with a resistivity of 0.01 Ωcm to 0.02 Ωcm. The concentration of oxygen during deposition was $10^{18}$ atoms/cm$^2$ or less. The epitaxial layer was removed together with the single-crystalline substrate such that a 200 nm thick portion of the epitaxial layer remained. The remaining portion was formed into a semiconductor layer 20. The semiconductor layer 20 had a dopant concentration of $1\times10^{16}$ atoms/cm$^2$ or less and was confirmed to be a full depletion layer.
Bonding conditions: In a room-temperature bonding machine, after a supporting substrate 10 and a semiconductor layer 20 were each irradiated with a FAB gun in a high vacuum of $1\times10^{-5}$ Pa or less such that bonded surfaces thereof were activated, the activated bonded surfaces were brought into contact with each other and were bonded together. Herein, an inner portion of the room-temperature bonding machine was covered with an insulating cover member.

Comparative Example 1

In Comparative Example 1, a comparative sample was formed under the same conditions as those of the above example except that bonding conditions were as described below.

Bonding conditions: In the room-temperature bonding machine, after a supporting substrate 10 and a semiconductor layer 20 were each irradiated with an ion gun in a high vacuum of $1\times10^{-5}$ Pa or less such that bonded surfaces thereof were activated, the activated bonded surfaces were brought into contact with each other and were bonded together. Herein, the inner portion of the room-temperature bonding machine was in such a state that a metal portion was exposed.

Comparative Example 2

In Comparative Example 2, a comparative sample was formed under the same conditions as those of the above example except that bonding conditions were as described below.

Bonding conditions: In the room-temperature bonding machine, after a supporting substrate 10 and a semiconductor layer 20 were each irradiated with an FAB gun in a high vacuum of $1 \times 10^{-5}$ Pa or less such that bonded surfaces thereof were activated, the activated bonded surfaces were brought into contact with each other and were bonded together. Herein, though the inner portion of the room-temperature bonding machine was covered with the insulating cover member, the amount of exposure was increased as compared to the example, whereby the amount of metal present at a bonding interface was increased.

Comparative Example 3

In Comparative Example 3, an oxide film ($SiO_2$ film) with a thickness of 300 nm was formed as a semiconductor layer 20 by thermally oxidizing a surface of a single-crystalline Si substrate. The oxide film was bonded to a supporting substrate under substantially the same bonding conditions as those of Comparative Example 1.

(Observation of Bonding Interface)

For each of the composite substrates of Example and Comparative Examples 1 and 2, the bonding interface between the supporting substrate and the semiconductor layer was observed in cross section using a transmission electron microscope (TEM) without performing heat treatment at higher than 300° C. after room-temperature bonding.

In particular, a cross section for observation was prepared by ion milling and was observed using a TEM (H-9000NAR manufactured by Hitachi High-Technologies Corporation) with an acceleration voltage of 200 kV at an observation magnification of 2,050,000 times (2.05 million times).

Figure 5:
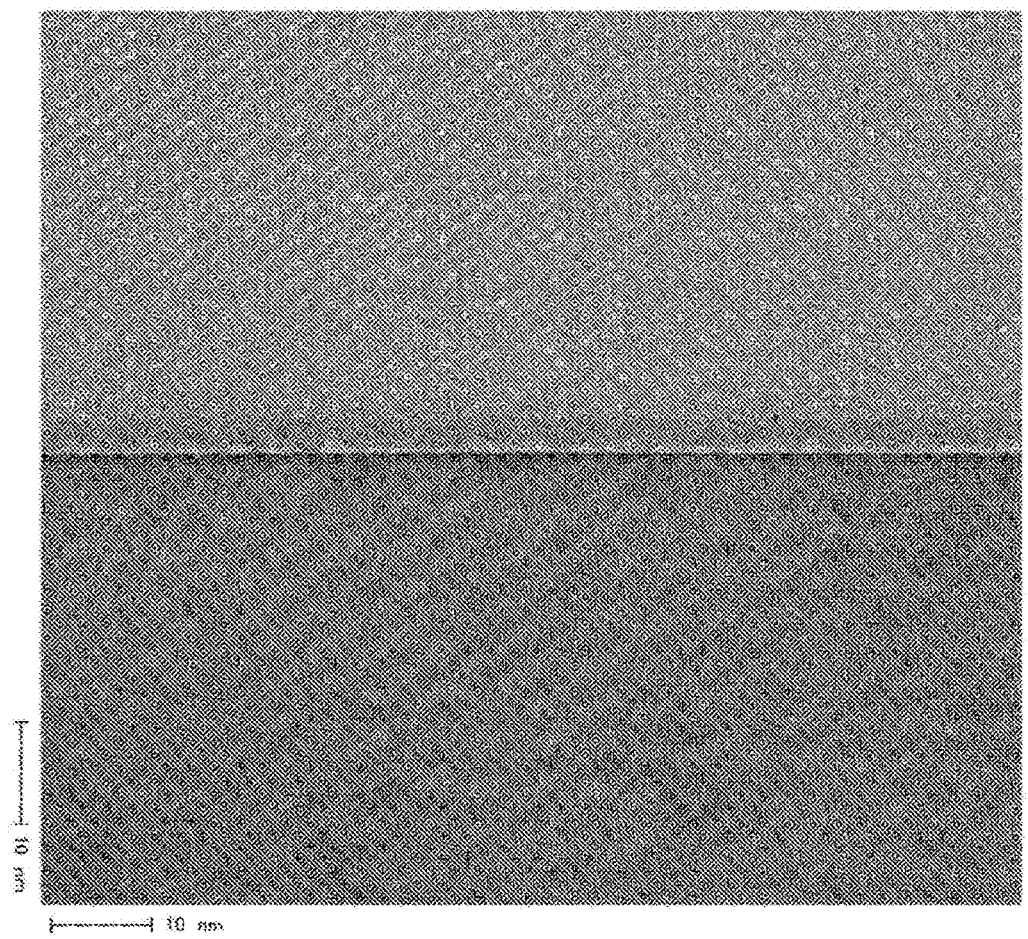
FIG. 5 is a cross-sectional TEM photograph of a bonding interface of a composite substrate according to Comparative Example 1.

As a result, in Example and Comparative Example 2, no interfacial inclusions (metal) could be observed. FIG. 5 shows a cross-sectional image observed in Comparative Example 1. In FIG. 5, a hybrid layer with a thickness of 5 nm or less was confirmed at the interface.

(Heating Step)

Next, the composite substrates of Example 1 and Comparative Examples 1 to 3 were heated at 900° C. for 30 minutes in an oxygen atmosphere. After being heated as described above, the composite substrates of Example 1 and Comparative Examples 1 to 3 were measured as described below.

(Amount of Metal)

For Example 1 and Comparative Examples 1 and 2, the density of interfacial inclusions 30 was measured.

In particular, after the thickness of each semiconductor layer 20 was reduced to 500 nm, the upper surface of the semiconductor layer 20 of the composite substrate 1 was masked with a mask having an opening with a diameter of 50 mm, the semiconductor layer 20 exposed through the opening of the mask was etched with a mixture of nitric acid and hydrofluoric acid and was dissolved in an etching solution. After the whole of the dissolved solution was taken in an evaporation pan, was heated, was evaporated, and was then dried, the residue was dissolved in acid and was measured by ICP-MS. These operations were performed in a clean room (Class 100).

A measurement result by ICP-MS, that is, the mass (ng) of each element was divided by the atomic weight of the element, whereby the mass of the element was converted into the number of moles thereof. The number of moles thereof was multiplied by Avogadro's number, whereby the number of moles thereof was converted into the number of atoms of thereof. From observation results of the bonding interface, it was assumed that these metal atoms were present in a 5 nm or less thick portion extending from the interface. The number of atoms of thereof was divided by 5 nm and the area of the mask opening, whereby the number of atoms of thereof was converted into the number of atoms of thereof per unit area. Results thereof are shown in Table 1. Incidentally, the lower limit of detection of each element is also shown in Table 1.

Incidentally, an element in a component making up the supporting substrate 10 and an element in a component making up the semiconductor layer 20, that is, Al and Si are omitted from metal elements making up the interfacial inclusions 30.

TABLE 1

| | Density: number of atoms per unit area × $10^{10}$ atoms/cm² | | | | | | | | | |
|---|---|---|---|---|---|---|---|---|---|---|
| | Na | K | Ca | Ti | Cr | Fe | Ni | Cu | Zn | Total |
| Example | — | — | — | — | 1.2 | 4.4 | 30 | — | — | 3.56E+11 |
| Comparative Example 1 | 37 | 8.6 | 100 | 90 | 220,000 | 770,000 | 73,000 | 3,800 | 41 | 1.07E+16 |
| Comparative Example 2 | 4 | — | 8.4 | 3.2 | 4,300 | 1,500 | 1,400 | 73 | 1.9 | 2.08E+14 |
| Lower limit of detection | 2.7 | 1.6 | 1.5 | 1.3 | 1.2 | 1.1 | 1 | 0.97 | 0.94 | |

As shown in Table 1, in Comparative Example 2, in which activation was performed using the FAB gun instead of the ion gun, the amount of metals is more than $1 \times 10^{12}$ atoms/cm². However, it is confirmed that a metal amount of $1 \times 10^{12}$ atoms/cm² or less can be achieved first in Example 1, in which the exposure of metal was adjusted using a protective cover.

Incidentally, for confirmation, depthwise analysis was performed from the upper surface of each semiconductor layer in a thickness direction by SIMS in Example 1 and Comparative Examples 1 and 2. As a result, no metal element was detected in a portion more than 5 nm apart from the bonding interface. This confirmed that the above conversion method by ICP-MS was correct.

(Bond Strength)

Next, for above-mentioned Example 1 and Comparative Examples 1 and 2, bond strength was measured.

In particular, for Example 1 and Comparative Examples 1 and 2, about 1 cm square pieces were cut out of arbitrary five portions (a peripheral portion, a central portion, and the like) of each composite substrate, followed by the measurement of tensile stress using a thin-film adhesion strength measurement system, Romulus, manufactured by Quad Group Inc. As a result, it could be confirmed that Example 1 obtained substantially the same as that of Comparative Examples 1 and 2.

(Confirmation of State of Bonding with Little Mismatching)

Next, the bonding interface of the composite substrate 1 of Example 1 was observed.

In particular, a cross section was formed by ion milling so as to include the bonding interface between the semiconductor layer 20 and supporting substrate 10 of the composite substrate 1 and was observed using a TEM (H-9000NAR manufactured by Hitachi High-Technologies Corporation) with an acceleration voltage of 200 kV at an observation magnification of 2,050,000 times (2.05 million times).

Figure 6:
FIG. 6 is a cross-sectional TEM photograph of a bonding interface of a composite substrate according to Example.
Figure 7A:
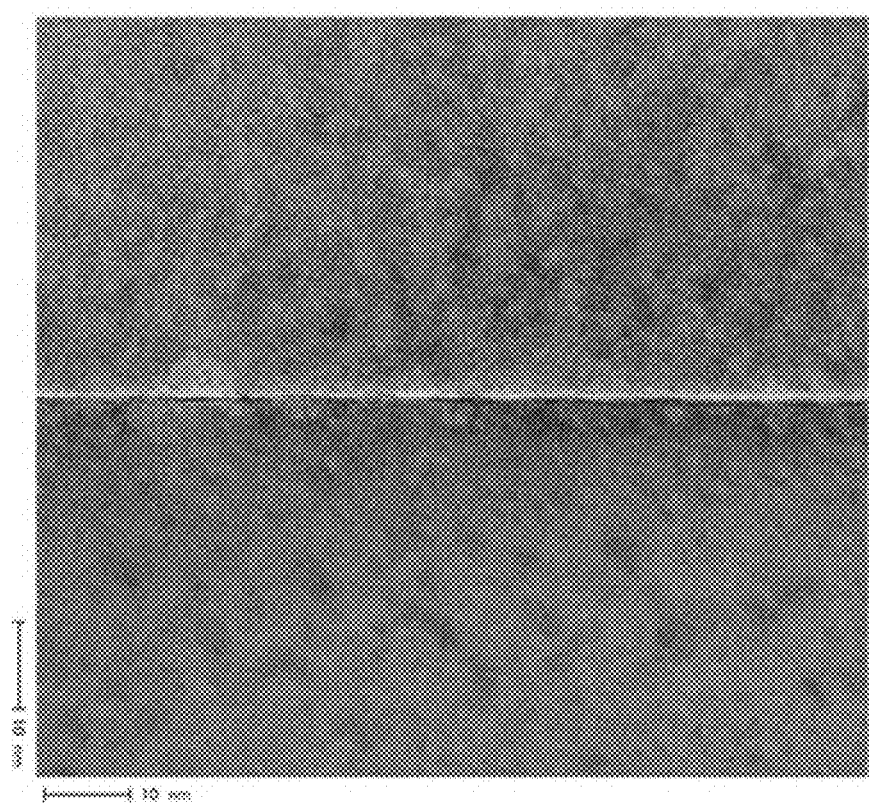
FIG. 7A is a cross-sectional TEM photograph of a bonding interface of the composite substrate according to Example.
Figure 7B:
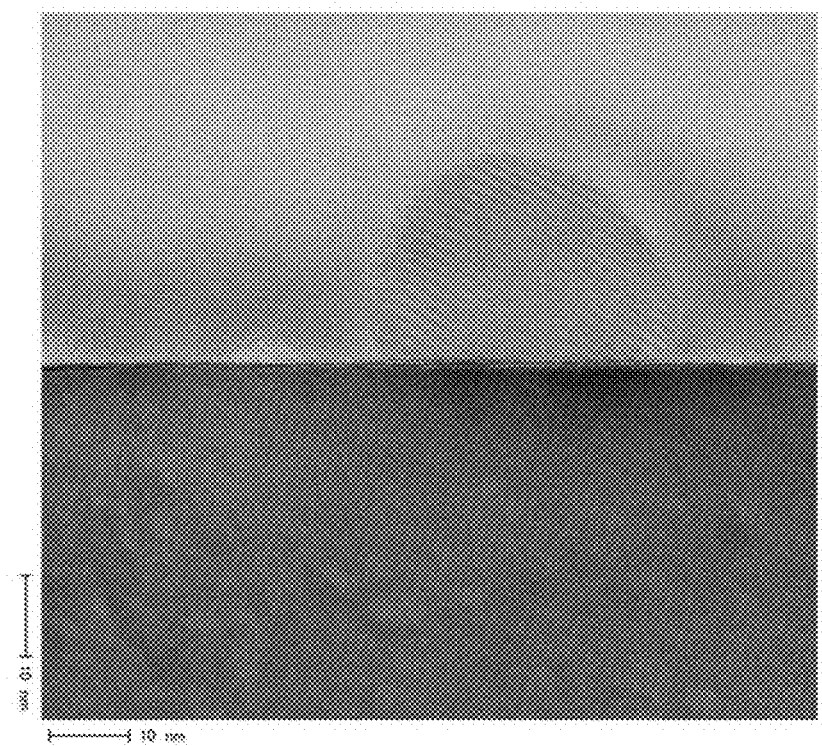
FIG. 7B is a cross-sectional TEM photograph of a bonding interface of the composite substrate according to Comparative Example 1.
Figure 7C:
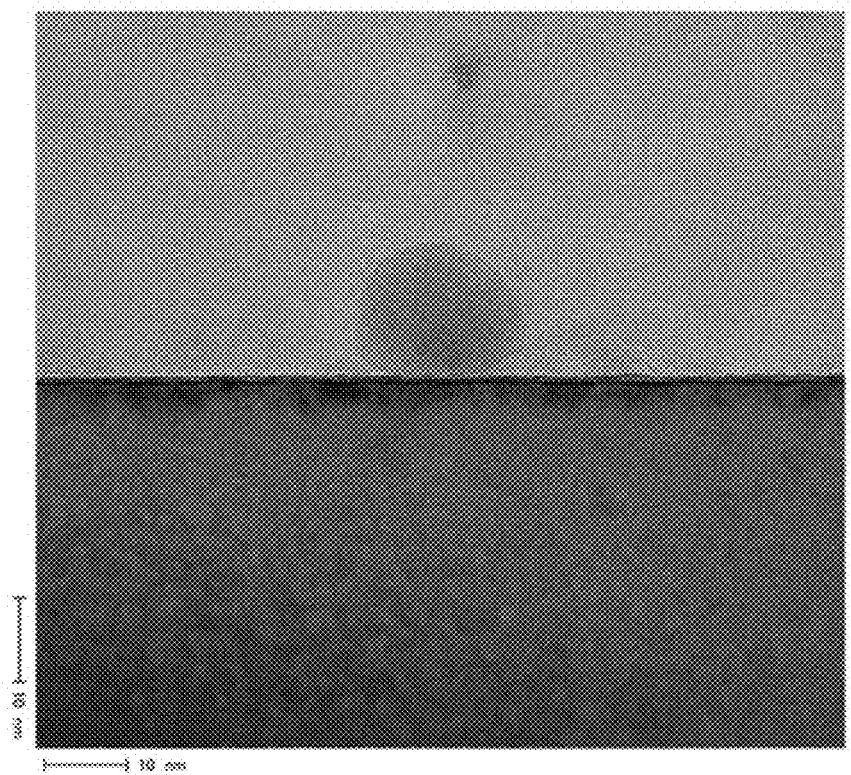
FIG. 7C is a cross-sectional TEM photograph of a bonding interface of a composite substrate according to Comparative Example 2.
Figure 7D:
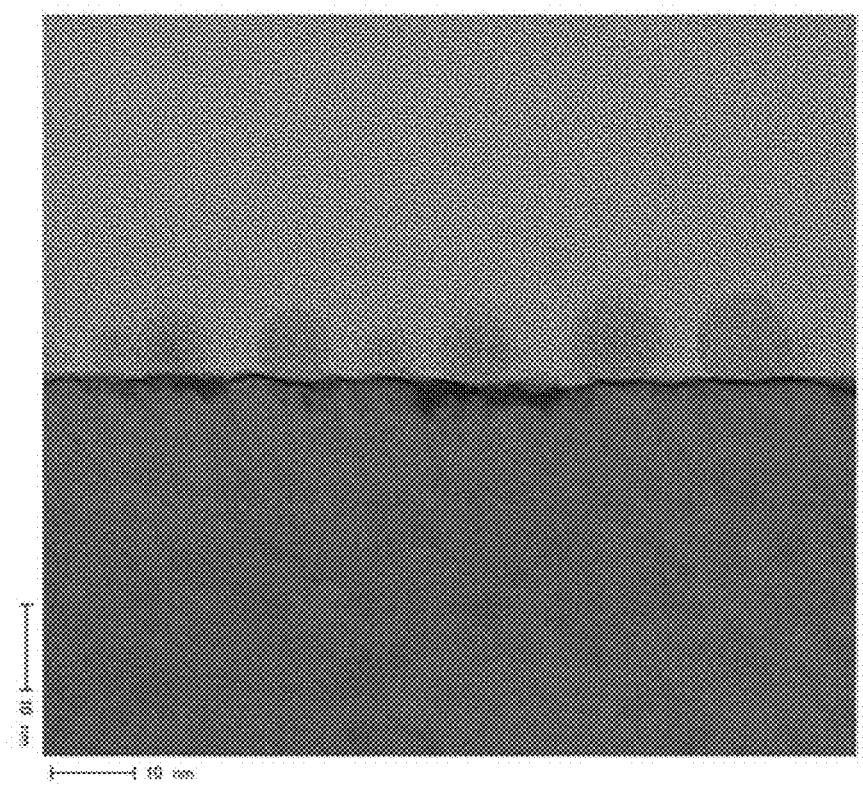
FIG. 7D is a cross-sectional TEM photograph of a bonding interface of a composite substrate according to Comparative Example 3.

As a result, it could be confirmed that arrays of atoms in the supporting substrate 10 and arrays of atoms in the semiconductor layer 20 were partly disordered at the interface therebetween over several atomic layers only as shown in FIG. 6 and they were bonded together with little mismatching. In particular, a mismatching portion (lattice mismatch portion) is 1 nm or less. Arrays of atoms in the mismatching portion are not significantly disordered. Therefore, even though different materials are bonded together, the performance of the semiconductor layer 20 can be enhanced without causing unintentional strain and stress due to strain in the semiconductor layer 20.

(Whether Metal is Aggregated)

Next, the composite substrates of the Example 1 and Comparative Examples 1, 2, and 3 were heat-treated at 900° C. for 30 minutes and were observed in cross section.

In particular, a cross section was formed by ion milling so as to include the bonding interface between the semiconductor layer 20 and supporting substrate 10 of each composite substrate 1 and was observed using a TEM (H-9000NAR manufactured by Hitachi High-Technologies Corporation) with an acceleration voltage of 200 kV at an observation magnification of 2,050,000 times (2.05 million times).

As a result, as shown in FIGS. 7A to 7D and as is clear from these figures, the aggregation of a metal element was confirmed in Comparative Examples 1, 2, and 3 and aggregation was not confirmed in Example 1.

This confirmed that it was important for a composite substrate needing to be heat-treated for the purpose of fabricating semiconductor devices to adjust the metal density at a bonding interface to $1\times10^{12}$ atoms/cm$^2$ or less. Furthermore, it was confirmed that such metal density applied to the case of having a layer made of an oxide at a bonding interface.

Example 2

A composite substrate 1 was obtained in substantially the same manner as that described in Example 1 except that a surface of a supporting substrate 10 and a surface of a semiconductor layer 20 were separately activated with a FAB gun 102 as shown in FIG. 8(d).

The amount of metal in interfacial inclusions 30 of Example 2 was measured by substantially the same method as the above-mentioned method for measuring the amount of metal. As a result, a little more than $1\times10^{10}$ atoms/cm$^2$ could be achieved. It was confirmed that a bond strength substantially equal to the bond strength of Example 1 was achieved.

Example 3

A composite substrate 1 was obtained in substantially the same manner as that described in Example 1 except that the irradiation of a FAB gun 102 was performed twice. Conditions for performing the irradiation of the FAB gun 102 twice were as described below.

That is, the first irradiation was performed such that a surface of a supporting substrate 10 and a surface of a semiconductor layer 20 were separately activated with the FAB gun 102 as shown in FIG. 8(d). Irradiation conditions were an acceleration voltage of 1.8 kV and an irradiation time of 5 minutes.

Figure 2:
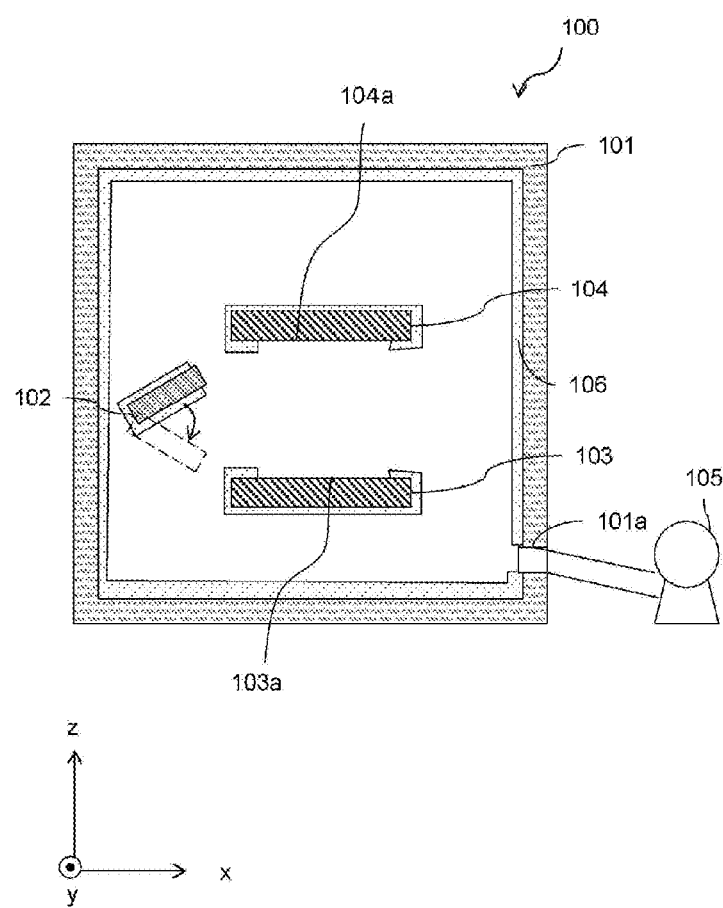
FIG. 2 is a schematic view of a room-temperature bonding machine 100.

The second irradiation was performed such that a surface of the supporting substrate 10 and a surface of the semiconductor layer 20 were activated in such a state that these surfaces faced each other as shown in FIG. 2. Irradiation conditions were an acceleration voltage of 1.0 kV and an irradiation time of 1 minute.

The amount of metal in interfacial inclusions 30 of Example 3 was measured by substantially the same method as the above-mentioned method for measuring the amount of metal. As a result, about $1\times10^{11}$ atoms/cm$^2$ could be achieved. It was confirmed that a bond strength substantially equal to the bond strength of Example 1 was achieved.

The composite substrate 1 was manufactured by irradiating the FAB gun 102 twice as described above and was measured for bond strength. As a result, it was confirmed that the composite substrate 1 had a bond strength substantially equal to the bond strength of Example 1.

Comparative Example 4

In a room-temperature bonding machine shown in FIG. 2, after a surface of a supporting substrate 10 and a surface of a semiconductor layer 20 were activated and were then left in a vacuum chamber 101 for a certain time, the two were brought into contact with each other. However, the two could not be bonded together. This confirmed that even in a vacuum, a desired bond strength could not be achieved after time elapsed subsequently to activation.

REFERENCE SIGNS LIST

1 Composite substrate
10 Supporting substrate
20 Semiconductor layer
30 Interfacial inclusions
40 Oxide layer
101 Vacuum vessel (vacuum chamber)
102 FAB gun(s)
107 Shielding plate
108 Waiting space

The invention claimed is:
1. A composite substrate, comprising:
a supporting substrate composed of an insulating material;
a semiconductor layer which is overlaid on the supporting substrate and is directly bonded to the supporting substrate, and which is composed of a single-crystalline semiconductor; and interfacial inclusions with a density of $10^{12}$ atoms/cm$^2$ or less which are at an interface between the supporting substrate and the semiconductor layer, and which are composed of a metal element different from elements composing the supporting substrate and the semiconductor layer, wherein the semiconductor layer comprises a dopant and has such a distribution that a concentration of the dopant decreases gradually from an upper surface of the semiconductor layer to the supporting substrate and the interface on the supporting substrate side is undoped.

2. The composite substrate according to claim 1, wherein the semiconductor layer has an oxygen concentration of less than $10^{18}$ atoms/cm$^3$.

3. The composite substrate according to claim 1, wherein the semiconductor layer is composed of silicon and the supporting substrate is composed of a sapphire substrate and has a surface which is bonded to the semiconductor layer and which is an R-plane.

4. The composite substrate according to claim 1, further comprising an oxide layer which is located on the semiconductor layer and which mainly comprises a material composing of the semiconductor layer, wherein a density of silicon at the interface between the semiconductor layer and the supporting substrate is less than a density of silicon at an interface between the semiconductor layer and the oxide layer.

5. A composite substrate, comprising:
a supporting substrate composed of an insulating material;
a semiconductor layer which is overlaid on the supporting substrate and is directly bonded to the supporting substrate, and which is composed of a single-crystalline semiconductor; and
interfacial inclusions with a density of $10^{12}$ atoms/cm$^2$ or less which are at an interface between the supporting substrate and the semiconductor layer, and which are composed of a metal element different from elements composing the supporting substrate and the semiconductor layer, wherein the semiconductor layer comprises a lattice mismatch portion which is located on the supporting substrate side, which has a thickness of 1 nm or less, and in which arrays of atoms are disordered.

6. The composite substrate according to claim 5, wherein the semiconductor layer has an oxygen concentration of less than $10^{18}$ atoms/cm$^3$.

7. The composite substrate according to claim 5, wherein the semiconductor layer comprises a dopant and has such a distribution that a concentration of the dopant decreases gradually from an upper surface of the semiconductor layer to the supporting substrate and the interface on the supporting substrate side is undoped.

8. The composite substrate according to claim 5, wherein the semiconductor layer is composed of silicon and the supporting substrate is composed of a sapphire substrate and has a surface which is bonded to the semiconductor layer and which is an R-plane.

9. The composite substrate according to claim 5, further comprising an oxide layer which is located on the semiconductor layer and which mainly comprises a material composing of the semiconductor layer, wherein a density of silicon at the interface between the semiconductor layer and the supporting substrate is less than the density of silicon at a interface between the semiconductor layer and the oxide layer.

10. A method of manufacturing a composite substrate that comprises a supporting substrate composed of an insulating material; a semiconductor layer which is overlaid on the supporting substrate and is bonded to the supporting substrate, and which is composed of a single-crystalline semiconductor; and interfacial inclusions with a density of $10^{12}$ atoms/cm$^2$ or less which are at an interface between the supporting substrate and the semiconductor layer which are composed of a metal element different from elements composing the supporting substrate and the semiconductor layer, the method comprising:

a step of activating a surface of the supporting substrate and a surface of the semiconductor layer in a vacuum vessel using a FAB gun in such a state that the surface of the supporting substrate and the surface of the semiconductor layer do not face each other; and a step of bonding the supporting substrate and the semiconductor layer together at room temperature in such a manner that a first surface activated of the supporting substrate is brought into contact with a second surface activated of the semiconductor layer.

11. The method of manufacturing the composite substrate according to claim 10, wherein in the step of activating, the surface of the supporting substrate and the surface of the semiconductor layer are activated using the FAB gun in such a manner that the surface of the supporting substrate and the surface of the semiconductor layer are directed in the same direction and positions in plan view are placed so as to be displaced.

12. The method of manufacturing the composite substrate according to claim 10, wherein in the step of activating, the surface of the supporting substrate and the surface of the semiconductor layer are spaced apart from each other in a thickness direction and a shielding plate composed of an insulator is placed between the surface of the supporting substrate and the surface of the semiconductor layer.

13. The method of manufacturing the composite substrate according to claim 12, wherein in the step of activating, one composed of a material comprising the same element as an element in a main component composing the supporting substrate or the semiconductor layer is used as the shielding plate.

14. The method of manufacturing the composite substrate according to claim 10, wherein in the step of activating, the surface of the supporting substrate and the surface of the semiconductor layer are activated at the same time.

15. The method of manufacturing the composite substrate according to claim 10, wherein in the step of activating, while one of the surface of the supporting substrate and the surface of the semiconductor layer is being activated, the other is moved to a waiting space isolated from a space which is a portion of the vacuum vessel and in which the FAB gun is irradiated.

16. The method of manufacturing the composite substrate according to claim 10, wherein in the step of activating, a plurality of FAB guns that are the same as the FAB gun are used and are placed in positions not facing each other.

17. The method of manufacturing the composite substrate according to claim 10, wherein in the step of activating, the surface of the supporting substrate and the surface of the semiconductor layer are irradiated with the FAB gun twice at an interval.

18. The method of manufacturing the composite substrate according to claim 17, wherein in the step of activating, the FAB gun is irradiated under such conditions that the cumulative irradiation energy of the second irradiation is less than that of the first irradiation.

\* \* \* \* \*